US011756815B2

(12) United States Patent
Seo et al.

(10) Patent No.: US 11,756,815 B2
(45) Date of Patent: Sep. 12, 2023

(54) APPARATUS FOR AND METHOD OF MONITORING WARPAGE OF SUBSTRATE, SUBSTRATE TREATMENT APPARATUS, AND SUBSTRATE-TYPE SENSOR

(71) Applicant: SEMES CO., LTD., Cheonan-si (KR)

(72) Inventors: Yong Jun Seo, Hwaseong-si (KR); Sang Hyun Son, Busan (KR); Sang Min Ha, Daegu (KR); Dong Ok Ahn, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 281 days.

(21) Appl. No.: 17/083,189

(22) Filed: Oct. 28, 2020

(65) Prior Publication Data

US 2021/0134628 A1 May 6, 2021

(30) Foreign Application Priority Data

Oct. 31, 2019 (KR) .......................... 10-2019-0137479

(51) Int. Cl.
| | |
|---|---|
| *H01L 21/67* | (2006.01) |
| *H01L 23/00* | (2006.01) |
| *H01L 21/324* | (2006.01) |
| *G01P 15/02* | (2013.01) |
| *G01C 19/00* | (2013.01) |
| *H01L 23/498* | (2006.01) |

(52) U.S. Cl.
CPC ........ *H01L 21/67248* (2013.01); *G01C 19/00* (2013.01); *G01P 15/02* (2013.01); *H01L 21/324* (2013.01); *H01L 21/67103* (2013.01); *H01L 23/4985* (2013.01); *H01L 23/562* (2013.01)

(58) Field of Classification Search
CPC ............. H01L 21/67248; H01L 21/324; H01L 21/67103; H01L 23/4985; H01L 23/562; H01L 21/67051; H01L 21/67288; H01L 22/12; H01L 21/67253; H01L 22/26; H01L 22/34; G01C 19/00; G01P 15/02; H05K 1/189; H05K 2201/10159
See application file for complete search history.

(56) References Cited

U.S. PATENT DOCUMENTS

| | | | |
|---|---|---|---|
| 6,378,378 B1* | 4/2002 | Fisher | .................. G01L 9/0042 |
| | | | 73/754 |
| 10,345,102 B2 | 7/2019 | Saito | |
| 2013/0029433 A1 | 1/2013 | Sun et al. | |
| 2019/0113324 A1* | 4/2019 | Hwang | ............. H01L 21/67259 |
| 2019/0295873 A1* | 9/2019 | Hirochi | ............ H01L 21/68707 |
| 2022/0013388 A1* | 1/2022 | Daugherty | ........ H01L 21/67288 |

FOREIGN PATENT DOCUMENTS

| | | |
|---|---|---|
| JP | 2014123762 | 7/2014 |
| KR | 1020010029847 | 4/2001 |
| KR | 1020160145637 | 12/2016 |
| KR | 10-2019-0054370 A | 11/2017 |
| KR | 10-2019-0042839 A | 4/2019 |

* cited by examiner

*Primary Examiner* — Xin Y Zhong (57) ABSTRACT

Disclosed is an apparatus for precisely monitoring warpage deformation of a substrate. The apparatus includes a sensing unit and a processor. The sensing unit is removably mounted on the substrate and detects information on the warpage deformation of the substrate during a treatment process performed on the substrate. The processor generates warpage state information on the basis of the warpage information detected by the sensing unit.

19 Claims, 5 Drawing Sheets

APPARATUS FOR AND METHOD OF MONITORING WARPAGE OF SUBSTRATE, SUBSTRATE TREATMENT APPARATUS, AND SUBSTRATE-TYPE SENSOR

CROSS REFERENCE TO RELATED APPLICATION

The present application claims priority to Korean Patent Application No. 10-2019-0137479, filed on Oct. 31, 2019, the entire contents of which are herein incorporated by reference.

BACKGROUND OF THE INVENTION

1. Field of the Invention

Embodiments of the present invention relate to a method and apparatus for monitoring warpage deformation that occurs during a treatment process performed on a substrate, and a substrate treatment apparatus. In addition, embodiments of the present invention relate to a substrate-type sensor used to detect warpage deformation of a substrate during the treatment of the substrate.

2. Description of the Related Art

In order to manufacture a semiconductor device, various treatment processes such as cleaning, deposition, photolithography, and etching are performed. Each of the processes is performed inside a treatment space of a chamber, and the substrate (i.e., wafer) treated in the treatment space is subjected to an environment (processing conditions) suitable for the purposes of the process. For example, the treatment space may be in conditions of high temperature and vacuum pressure, and the substrate may be rotated at high speed.

The substrate may be deformed due to the processing conditions during the treatment of the substrate. For example, the substrate may be concavely or convexly warped. The warping deformation (i.e., warpage deformation) may result in the substrate being defective, and such warping defamation more easily occurs when the substrate has a relatively larger size.

However, it is difficult to detect warping deformation of a substrate during a treatment process of the substrate because the treatment process is usually performed in a sealed treatment space that cannot be accessed from the outside. The warping deformation of the substrate can be confirmed after the completion of the treatment process. However, since there is a case where the substrate is warped during the treatment process and is then restored to the original shape after the completion of the treatment process, it is difficult to determine the degree of warping and the time at which the warping defamation of the substrate occurred. Therefore, even though the warping deformation negatively affects the treatment process, it is difficult to accurately determine the cause of the negative effect. A machine vision camera can be used to monitor the warping deformation of a substrate during a treatment process. However, since a treatment space is very small, there is a problem in that the treatment space has no room for the vision camera.

DOCUMENT OF RELATED ART

Patent Document (Patent Document 1) Korean Patent Application Publication No. 10-2019-0042839 (Apr. 25, 2019)
(Patent Document 2) Korean Patent Application Publication No. 10-2019-0054370 (May 22, 2019)

SUMMARY OF THE INVENTION

An objective of embodiments of the present invention is to provide an apparatus for and method of monitoring warping deformation of a substrate, a substrate treatment apparatus, and a substrate-type sensor all of which can improve monitoring efficiency for warping deformation of a substrate.

Problems to be solved by the present invention are not limited to ones described above, and other problems that are not mentioned above but can be solved by the present invention will be clearly understood by those skilled in the art from the following description.

According to an exemplary embodiment of the present invention, a substrate warpage monitoring apparatus includes a sensing unit that is removably mounted on a substrate and which detects a warpage information of the substrate during a treatment process performed on the substrate, and a processor that is operatively coupled to the sensing unit and generates warpage state information of the substrate on the basis of warpage information detected by the sensing unit.

The sensing unit includes a plurality of sensing modules disposed at positions spaced apart from each other on the substrate and configured to detect the warpage information generated at each of the positions at which the sensing modules are disposed.

The sensing modules are spaced apart from each other at regular intervals in a radial direction from a center portion of the substrate.

The plurality of sensing modules include at least one central sensing module disposed in a central region of the substrate, a plurality of peripheral sensing modules disposed in an edge region of the substrate, and a plurality of intermediate sensing modules disposed in an intermediate region between the central region and the edge region.

Each of the plurality of sensing modules includes an acceleration sensor or a gyro sensor. Alternatively, each of the plurality of sensing modules includes a composite sensor including both the acceleration sensor and the gyro sensor.

The substrate warpage monitoring apparatus further includes a printed circuit board (PCB) that is removably provided on the substrate and on which the processor is mounted. The PCB may be a flexible printed circuit board (FPCB) that flexibly bends when the substrate is warped.

The substrate warpage monitoring apparatus further includes a memory unit that stores the warpage state information generated by the processor. The memory unit is mounted on the PCB.

The substrate warpage monitoring apparatus further includes a communication unit composed of a transmission module that transmits the warpage state information generated by the processor and a reception module that receives the warpage state information transmitted from the transmission module. The transmission module is mounted on the PCB.

The transmission module and the reception module transmit and receive the warpage state information through a wireless communication technique.

According to an exemplary embodiment of the present invention, a method of monitoring warpage deformation of a substrate includes removably mounting a sensing unit on a substrate to detect warpage information of the substrate, introducing the substrate provided with the sensing unit into a treatment space of a treatment chamber and performing a treatment process on the substrate in the treatment space, detecting warpage information of the substrate by the sensing unit during the treatment process performed on the substrate in the treatment space, and generating warpage state information of the substrate on the basis of the detected warpage information. The method further includes detecting at least one parameter selected from among pressure, temperature, and humidity of the treatment space during the treatment process performed on the substrate.

According to an exemplary embodiment of the present invention, a substrate warpage monitoring apparatus includes a chamber having a treatment space, a substrate support unit disposed in the treatment space and configured to support a substrate, a first sensing unit that is provided on the substrate supported by the substrate support unit and which detects a warpage information of the substrate during a treatment process performed on the substrate, and a processor that generates warpage state information of the substrate on the basis of the warpage information detected by the first sensing unit.

The substrate warpage monitoring apparatus further includes a second sensing unit provided on the substrate and configured to detect at least one parameter selected from among pressure, temperature, and humidity of the treatment space during the treatment process performed on the substrate.

The substrate support unit includes a spin head that supports and rotates the substrate in the treatment space.

The substrate warpage monitoring apparatus further includes a fluid supply unit that supplies a treatment fluid onto the substrate supported by the substrate support unit, thereby performing the treatment process on the substrate by supplying the treatment fluid onto the substrate and rotating the substrate.

The substrate mounted with the first sensing unit and the second sensing unit corresponds to a test substrate.

The test substrate, the first sensing unit, the second sensing unit, and the processor constitute a substrate-type sensor.

The substrate-type sensor includes a flexible printed circuit board that is provided on the substrate and on which the processor is mounted, a memory unit mounted on the flexible printed circuit board and configured to store the warpage state information generated by the processor and the information detected by the second sensing unit, and a transmission module mounted on the flexible printed circuit board and configured to transmit the warpage state information stored in the memory unit.

According to an exemplary embodiment of the present invention, a substrate-type sensor includes a test substrate, a sensing unit including a plurality of sensing modules disposed at respective positions spaced apart from each other on the test substrate and configured to detect warpage information of the test substrate at the respective positions on the test substrate, and a processor provided on the test substrate and configured to generate warpage state information of the test substrate on the basis of the warpage information detected by the plurality of sensing modules. Each of the plurality of sensing modules includes an acceleration sensor or a gyro sensor.

The substrate-type sensor further includes a memory unit provided on the test substrate and configured to store the warpage state information generated by the processor, and a transmission module provided on the test substrate and configured to transmit the warpage state information stored in the memory unit.

Technical solutions to the problems occurring in the related art will be clarified with reference to the following description of embodiments and the accompanying drawings. In addition, various solutions other than the solutions mentioned above may be further suggested in the following description.

With the embodiments of the present invention, it is possible to accurately monitor the warping deformation of a substrate during a treatment process performed on the substrate by using a simple configuration. For example, the warping deformation of a substrate can be monitored with a configuration in which a sensing unit and a processor are removably provided on an actual substrate. In the configuration, the sensing unit detects warping information of the substrate, and the processor generates warping state information of the substrate on the basis of the detected warping information. Alternatively, the warping deformation of a substrate can be monitored with a configuration in which a sensing unit and a processor are provided on a test substrate that has the same or similar shape factor to an actual substrate. In the configuration, the sensing unit detects warping information of the substrate, and the processor generates warping state information of the substrate on the basis of the detected warping information.

In addition, on the basis of the results of the monitoring of the warping deformation of a substrate, the treatment process conditions for the substrate can be managed such that the warping deformation of the substrate can be minimized.

The effect of the present invention is not limited thereto, and other effects that are not mentioned can be clearly understood, by those skilled in the art, from the following description and the accompanying drawings.

DESCRIPTION OF THE EXEMPLARY EMBODIMENTS

Hereinbelow, exemplary embodiments of the present invention will be described in detail with reference to the accompanying drawings such that the subject matter of the present invention can be easily practiced by those ordinarily skilled in the art to which the present invention pertains. The present invention can be embodied in various forms and should not be construed as being limited to the exemplary embodiments disclosed herein.

In describing exemplary embodiments of the present invention, well-known functions or constructions will not be described in detail when they may obscure the gist of the present invention, and components that perform the same functions or operations will be denoted by like reference numerals throughout the drawings and will not be redundantly described in detail.

Since at least some of the terms used herein are defined in consideration of the functions in the present invention, they can be expressed with different terms depending on the intentions of users, operators, and the like. Therefore, the definition of each term should be interpreted on the basis of the contents throughout the present specification. It will be further understood that when a component "comprises", "includes", or "has" another component, it means that the component may further include another component, not excluding a further component unless stated otherwise. It is to be understood in the following description that when one component is referred to as being "connected to", "combined with", or "coupled to" another component, it may include not only direct connection, but indirect connection with another component therebetween.

It is noted that throughout the drawings referenced to describe an embodiment of the present invention, the size of components, the thickness of lines, etc. may be exaggerated for clarity.

Although a substrate warpage monitoring apparatus, a substrate warpage monitoring method, and a substrate-type sensor according to the present invention can be applied to various semiconductor manufacturing apparatuses, embodiments of the present invention are directed to a case where a substrate warpage monitoring apparatus, a substrate warpage monitoring method, and a substrate-type sensor are applied to a substrate treatment apparatus that performs a fluid-involved treatment process such as cleaning on a substrate.

Figure 1:
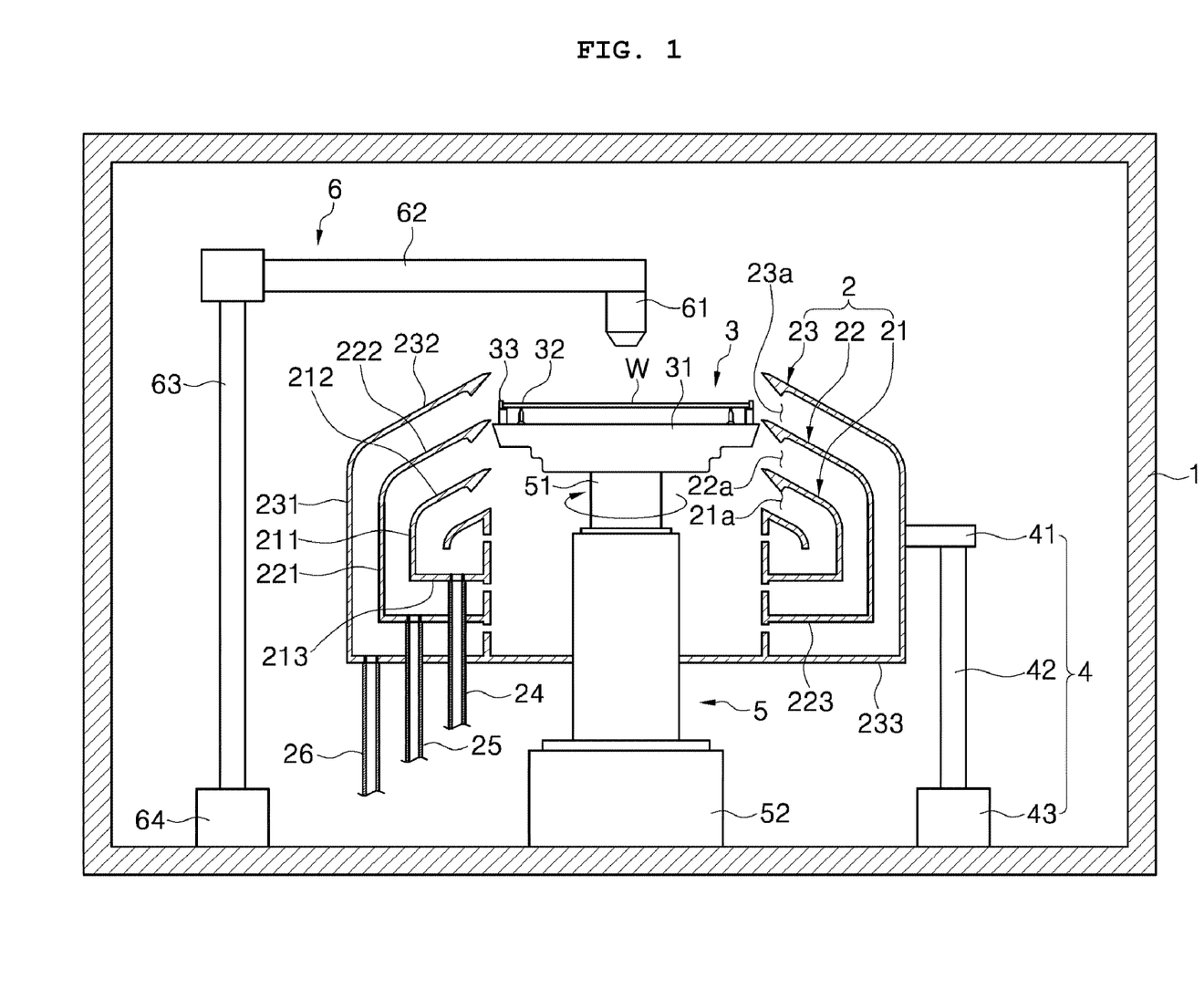
FIG. 1 is a cross-sectional view of a substrate treatment apparatus according to one embodiment of the present invention.

FIG. 1 is a view schematically illustrating the construction of a substrate treatment apparatus according to one embodiment of the present invention. Referring to FIG. 1, the substrate treatment apparatus according to one embodiment of the present invention includes a chamber (i.e., a treatment chamber) 1, a treatment vessel 2, a substrate support unit 3, a lift drive unit 4, a rotary drive unit 5, and a fluid supply unit 6.

The chamber 1 defines a treatment space in which a fluid-involved treatment process is performed on a substrate (wafer) W. The fluid-involved treatment process is performed at normal pressure or vacuum pressure. A vacuum pump (not illustrated) is connected to the chamber 1 to create a vacuum pressure environment in the treatment space of the chamber 1.

The treatment vessel 2 is installed in the chamber 1. The treatment vessel 2 has a cup-like shape. That is, the treatment vessel 2 has an opening in an upper surface thereof and an accommodation space configured to communicate with the opening formed in the upper surface. The substrate support unit 3 is disposed in the accommodation space of the treatment vessel 2. A treatment fluid is supplied to the upper surface of the substrate W (hereinafter, reference numeral W will be omitted) supported on the substrate support unit 3 through the fluid supply unit 6. The treatment vessel 2 collects the treatment fluid that is supplied to the substrate from the fluid supply unit 6.

The treatment vessel 2 includes a first cup member (also referred to as first treatment vessel) 21 that defines the accommodation space, a second cup member (also referred to as second treatment vessel) 22 that surrounds the first cup member 21 with a predetermined gap therebetween, and a third cup member (also referred to as third treatment vessel) 23 that surrounds the second cup member 22 with a predetermined gap therebetween. That is, the second cup member 22 is disposed between the first cup member 21 which is the innermost cup member and the third cup member 23 which is the outermost cup member. That is, the treatment vessel 2 is composed of a plurality of cup members 21, 22, and 23. The cup members 21, 22, and 23 may be used to collect different treatment fluids, respectively. The first cup member 21 has a first opening 21a through which a treatment fluid to be collected enters. An opening between the first cup member 21 and the second cup member 22 serves as a second opening 22a through which a treatment fluid to be collected enters. An opening between the second cup member 22 and the third cup member 23 serves as a third opening 23a through which a treatment fluid to be collected enters.

The first cup member 21 is composed of a first wall portion including a first lower wall 211 and a first upper wall 212, and a first bottom portion 213. The first wall portion defines the accommodation space. The first wall portion includes a first lower wall 211 having a cylinder shape with a uniform diameter and a uniform thickness and a first upper wall 212 having an overall truncated cone shape. That is, the first upper wall 212 is tapered to the top base from the bottom base. The first upper wall 212 is provided on top of the first lower wall 211. The first lower wall 211 and the first upper wall 212 may be implemented as an integrated wall. The upper end (i.e., rim) of the first upper wall 212 is provided with a first protrusion which is ring-shaped. The first protrusion protrudes downward from the lower surface of the upper end portion of the first upper wall 212. The first lower wall 211 is configured to stand on the first bottom portion 213.

The second cup member 22 is composed of a second wall portion including a second lower wall 221 and a second upper wall 222, and a second bottom portion 223. The second wall portion is positioned a predetermined distance away from the first wall portion and is configured to surround the first wall portion. The second wall portion includes a second lower wall 221 having a cylinder shape with a uniform diameter and a uniform thickness and a second upper wall 222 having an overall truncated cone shape. That is, the second upper wall 222 is tapered to the top base from the bottom base. The second upper wall 222 is provided on top of the second lower wall 221. The second lower wall 221 and the second upper wall 222 are implemented as an integrated wall. The upper end of the second upper wall 222 is higher than the upper end of the first upper wall 212. However, the diameter of the upper end of the second upper wall 222 is the same or similar to the diameter of the upper end of the first upper wall 212. Thus, a gap is naturally formed between the upper end of the first upper wall 212 and the upper end of the second upper wall 222 and is called the second opening 22a that serves as an inlet for treatment fluid. The upper end (i.e., rim) of the second upper wall 222 is provided with a second protrusion which is ring-shaped. The second protrusion protrudes downward from the lower surface of the upper end portion of the second upper wall 222. The second bottom portion 223 is positioned under the first bottom portion 213, with a predetermined distance therebetween. The second lower wall 221 is configured to stand on the second bottom portion 223.

The third cup member 23 is composed of a third wall portion 231+232 and a third bottom portion 233. The third wall portion 231+232 is positioned a predetermined distance away from the second wall portion and is configured to surround the second wall portion. The third wall portion 231+232 includes a third lower wall 231 having a cylinder shape with a uniform diameter and a uniform thickness and a third upper wall 232 having an overall truncated cone shape. That is, the third upper wall 232 is tapered to the top base from the bottom base. The third upper wall 232 is provided on top of the third lower wall 231. The third lower wall 231 and the third upper wall 232 are implemented as an integrated wall. The upper end of the third upper wall 232 is higher than the upper end of the second upper wall 222. However, the diameter of the upper end of the third upper wall 232 is the same or similar to the diameter of the upper end of the second upper wall 222. Thus, a gap is naturally formed between the upper end of the second upper wall 222 and the upper end of the third upper wall 232 and is called the third opening 23a serving as an inlet for treatment fluid. The upper end (i.e., rim) of the third upper wall 232 is provided with a third protrusion which is ring-shaped. The third protrusion protrudes downward from the lower surface of the upper end portion of the third upper wall 232. The third bottom portion 233 is positioned under the second bottom portion 223, with a predetermined distance therebetween. The third lower wall 231 is configured to stand on the third bottom portion 233.

The bottom portions 213, 223, and 233 of the respective cup members 21, 22, and 23 are connected with fluid drain pipes 24, 25, and 26, respectively. The treatment fluid collected in each of the cup members 21, 22, and 23 through a corresponding one of the openings 21a, 22a, and 23a is drained through a corresponding one of the fluid drain pipes 24, 25, and 26. The treatment fluids drained through the fluid drain pipes 24, 25, and 26 may undergo a regeneration process performed by a fluid regeneration apparatus (not illustrated) so that the treatment fluids can be recycled.

The substrate support unit 3 supports a substrate during a fluid-involved treatment process. The substrate support unit 3 includes a spinning head 31, supporting pins 32, and chuck pins 33.

The spinning head 31 has a circular upper surface. The spinning head 31 is disposed in the accommodation space defined in the treatment vessel 2. The spinning head 31 is rotated by the rotary drive unit 5. The rotary drive unit 5 rotates the spinning head 31 at high speed.

The supporting pins 32 are configured to protrude from the upper surface of the spinning head 31, thereby supporting a substrate placed thereon.

The chuck pins 33 are arranged a longer distance away from the center of the spinning head 31 than the supporting pins 32. The chuck pins 33 support the edge of the substrate while the spinning head 31 is rotated by the rotary drive unit 5, thereby preventing the substrate from being displaced in a horizontal direction.

The chuck pins 33 can be moved in a radial direction of the spinning head 31 by a pin drive module (not illustrated) such that the chuck pins 33 can be shuttled between a standby position and a support position. The standby position is a position farther from the center of the spinning head 31 than the support position. The chuck pins 33 stay in the standby position while a substrate is being loaded on or unloaded from the upper surface of the spinning head 31. On the other hand, when the loading is finished, the chuck pins 33 are moved to the support position to support the substrate thereon. During the treatment of the loaded substrate, the chuck pins 33 stay in the support position. When staying in the support position, the chuck pins 33 are in contact with the circumference of the substrate.

The lift drive unit 4 vertically moves the treatment vessel 2. The lift drive unit 4 can vertically move the cup members 21, 22, and 23 collectively or independently. When the treatment vessel 2 is moved up or down by the lift drive unit 4, the relative height of each of the cup members 21, 22, and 23 with respect to the substrate support unit 3 is changed. The lift drive unit 4 includes a bracket 41, a lifting shaft 42, and a shaft lifting module 43.

The bracket 41 may be mounted outside the treatment vessel 2. Specifically, the bracket 41 is mounted on the outer surface of the third wall portion 231+232 constituting the third cup member 23 which is the outermost cup member. The lifting shaft 42 is engaged with the bracket 41. The lifting shaft 42 is installed to vertically extend. The shaft lifting module 43 is configured to move the lifting shaft 42 upward and downward by using power supplied from a power source.

The lift drive unit 4 moves the treatment vessel 2 down to prevent interference between a substrate transport robot and the treatment vessel 2 when the substrate is loaded on or unloaded from the upper surface of the spinning head 31 by the substrate transport robot. In addition, the lift drive unit 4 can adjust the height of the treatment vessel 2 by moving the treatment vessel 2 up and down. In this case, the treatment vessel 2 is moved up or down such that a predetermined treatment fluid can be introduced into a targeted opening of the openings 21a, 22a, and 23a, depending on the kind of treatment fluid supplied to the substrate from the fluid supply unit 6.

Alternatively, the lift drive unit 4 may be configured to move the substrate support unit 3 up and down, instead of moving the treatment vessel 2 up and down.

The rotary drive unit 5 includes a drive shaft 51 coupled to the center of the bottom surface of the spinning head 31, and a shaft rotating unit 52 configured to rotate the drive shaft 51 using power supplied from a power source. When the drive shaft 51 is rotated by the shaft rotating unit 52, the spinning head 31 rotates in the same direction as the drive shaft 51. At this time, the substrate supported on the chuck pins 33 is also rotated in the same direction.

When the substrate is rotated by the rotary drive unit 5, the treatment fluid supplied onto the upper surface of the substrate scatters around the substrate, and the scattering treatment fluid enters a predetermined one of the openings 21a, 22a, and 23a.

The fluid supply unit 6 is configured to supply a treatment fluid onto the upper surface of the substrate supported on the substrate support unit 3. The fluid supply unit 6 includes a nozzle 61, a nozzle arm 62, an arm support prop 63, and a support prop drive module 64.

The arm support prop 63 is installed inside the treatment space of the chamber 1 but outside the treatment vessel 2. The arm support prop 63 is configured to extend in a vertical direction. The nozzle arm 62 is coupled to an upper end portion of the arm support prop 63 and is configured to extend in a horizontal direction. The nozzle 61 is disposed at a leading end of the nozzle arm 62 such that a treatment fluid is ejected downward from the nozzle 61. The support prop drive module 64 is configured to rotate, to elevate, or to rotate and elevate the arm support prop 63. When the support prop drive module 64 operates, the nozzle 61 performs rotary motion, vertical linear motion, or both.

In the fluid supply unit 6, the nozzle 61 is rotated around the arm support prop 63 by the support prop drive module 64 so that the nozzle 61 stays in a standby position or a supply position. That is, the nozzle 61 is shuttled between the standby position and the supply position by the support prop drive module 64. The standby position is a position that is outside a region directly above the treatment vessel 2, and the supply position is a position that is within a region directly above the treatment vessel 2. The nozzle 61 stays in the standby position while a substrate is being loaded on or unloaded from the upper surface of the spinning head 31. On the other hand, when the loading is finished, the nozzle 61 is moved to the supply position to supply a treatment fluid to the substrate.

The substrate treatment apparatus is preferably equipped with multiple fluid supply units 6 rather than one fluid supply unit 6. When the multiple fluid supply units 6 are installed, the fluid supply units 6 may supply respectively different fluids to the substrate.

The treatment fluid may be a cleaning solution such as sulfuric acid and phosphoric acid or a rinsing solution such as deionized water (DIW). The treatment fluid is transported from a fluid storage unit to the nozzle 61 through a fluid supply pipe.

The substrate treatment apparatus according to one embodiment of the present invention is equipped with a substrate warpage monitoring apparatus that monitors warping deformation of a substrate. The substrate warpage monitoring apparatus disposed in the treatment space of the chamber 1 of the substrate treatment apparatus detects warping deformation of a substrate during a fluid-involved treatment process in which a treatment fluid is supplied to the substrate by the fluid supply unit 6.

Figure 2:
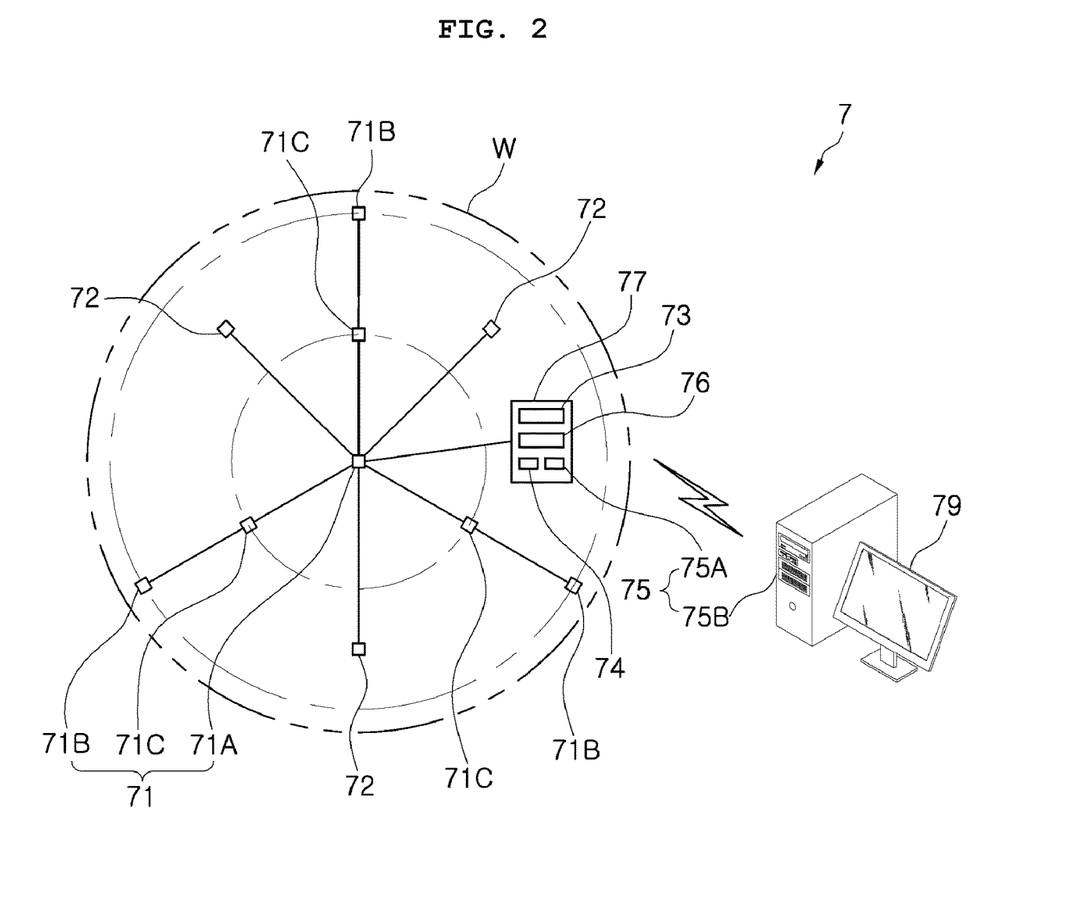
FIG. 2 is a configuration view illustrating one example of a substrate warpage monitoring apparatus applied to the substrate treatment apparatus according to one embodiment of the present invention.
Figure 3:
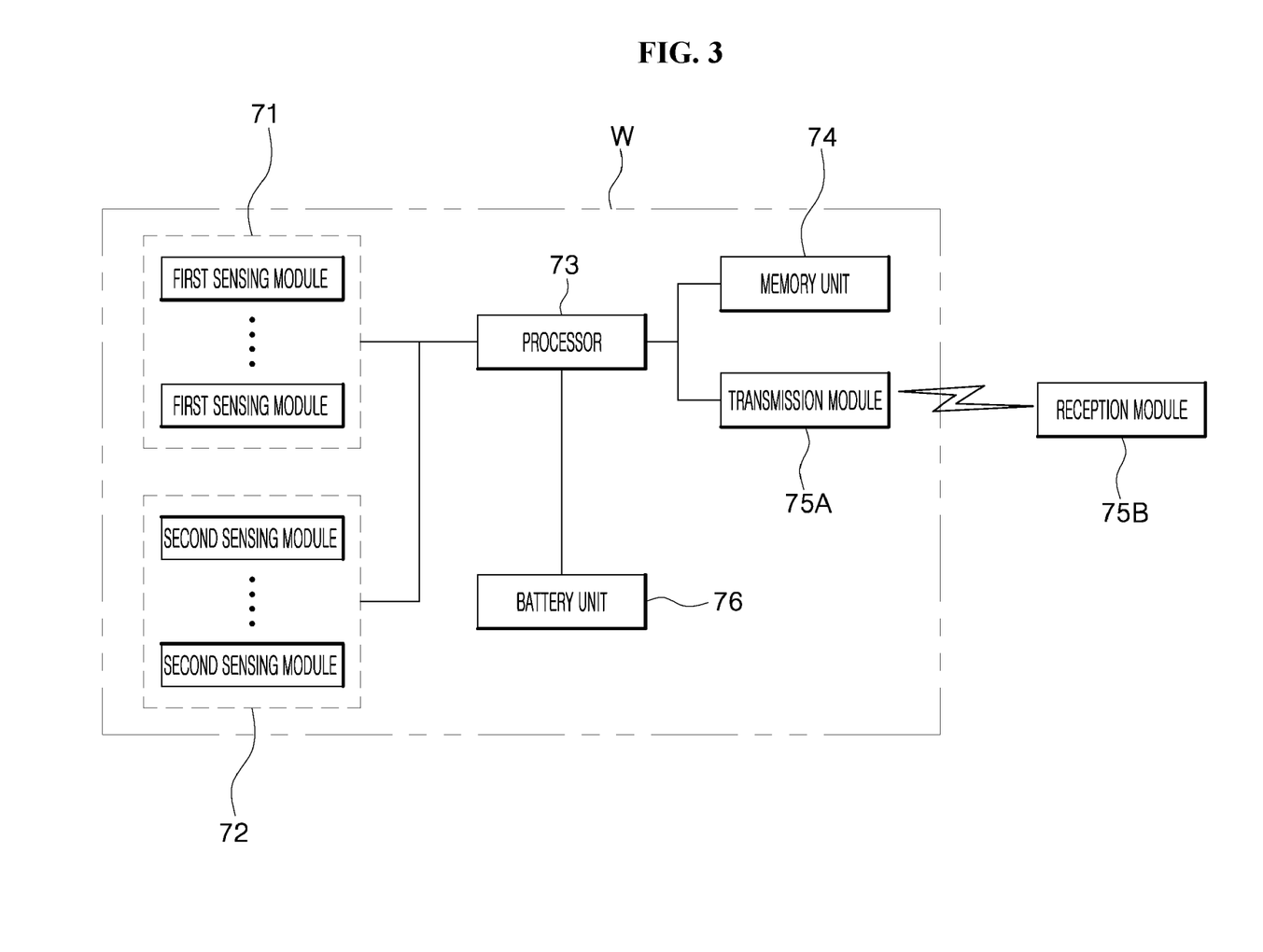
FIG. 3 is a block diagram illustrating one example of the substrate warpage monitoring apparatus applied to the substrate treatment apparatus according to one embodiment of the present invention.

FIGS. 2 and 3 illustrate a substrate warpage monitoring apparatus according to a first embodiment of the present invention.

Referring to FIGS. 2 and 3, the substrate warpage monitoring apparatus 7 includes a first sensing unit 71 that detects warping information (i.e., warpage information) of a substrate in real time and a processor 73 that generates warping state information (i.e., warpage state information) of the substrate on the basis of the warping information detected by the first sensing unit 71.

The first sensing unit 71 includes a plurality of sensing modules 71A, 71B, and 71C. The sensing modules 71A, 71B, and 71C are disposed at respective positions spaced apart from each other on the substrate. When warping deformation occurs at each position on the substrate, warping information at each position on the substrate is detected. Each of the sensing modules 71A, 71B, and 71C includes an inclinometer (also called tilt sensor) that detects an inclination, tilt, or slope as the warping information of the substrate. The inclinometer detects the slope of the substrate when warping deformation such as concave or convex warping occurs.

All of the inclinometers of the respective sensing modules 71A, 71B, and 71C may be implemented with acceleration sensors. Alternatively, the inclinometers may be implemented with gyro sensors. Alternatively, some of the sensing modules 71A, 71B, and 71C may include an acceleration sensor as the inclinometer and the others may include a gyro sensor as the inclinometer. Depending on embodiments, each of the sensing modules 71A, 71B, and 71C may include a composite sensor having an acceleration sensor and a gyro sensor. When a substrate is warped so that the surface of the substrate has a slope, the acceleration sensor mounted in the warped region of the substrate is inclined. In this case, the acceleration sensor detects the slope using an acceleration value of the movement thereof. In the same case, the gyro sensor detects the slope using an angular velocity attributable to the movement thereof.

In terms of a relatively long time, the acceleration sensor produces correct values but the gyro sensor produces incorrect values the error of which increases with time. However, in terms of a short time, the gyro sensor provides a correct value which may be different from the value produced by the acceleration sensor. The composite sensor including both the acceleration sensor and the gyro sensor can compensate for the disadvantages of each of the acceleration sensor and the gyro sensor by using an appropriate algorithm such as a Kalman filter.

Each of the sensing modules 71A, 71B, and 71C is connected to the processor 73 via a conductor. The warping information of the substrate detected by each of the sensing modules 71A, 71B, and 71C is transmitted to the processor 73. The processor 73 collects the values of the slopes detected at various positions by the sensing modules 71A, 71B, and 71C and generates warping state information including a position at which warping deformation occurs and the degree of warping at the position.

The sensing modules 71A, 71B, and 71C are evenly dispersed on the substrate and are arranged in this order at regular intervals in a radial direction from the center of the substrate. Referring to FIG. 2, the plurality of sensing modules include one central sensing module 71A disposed in a central region on the substrate, a plurality of peripheral sensing modules 71B disposed in an edge region of the substrate, and a plurality of intermediate sensing modules 71C disposed in an intermediate region between the central region and the edge region. The peripheral sensing modules 71B are equiangularly spaced from each other. The intermediate sensing modules 71C are equiangularly spaced from each other. For example, the number of the peripheral sensing modules 71B is three and the number of the intermediate sensing modules 71C is three. The central sensing module 71A detects the slope of the central region of the substrate, the multiple peripheral sensing modules 71B detect the slope of the edge region of the substrate, and the multiple intermediate sensing modules 71C detect the slope of the intermediate region of the substrate. The processor 73 generates the warping state information of the substrate on the basis of the slopes of the central region, the edge region, and the intermediate region of the substrate.

Each of the sensing modules 71A, 71B, and 71C is removably attached to the substrate. For example, each of the sensing modules 71A, 71B, and 71C is temporarily attached to the substrate with a temporary fixing means having excellent heat resistance and chemical resistance. The temporary fixing means may be a double-sided silicon tape.

The substrate warpage monitoring apparatus 7 further includes a memory unit 74 that stores the warping state information generated by the processor 73, a transmission module 75A that transmits the warping state information generated by the processor 73, and a reception module 75B that receives the warping state information transmitted from the transmission module 75A. The substrate warpage monitoring apparatus 7 further includes a printed circuit board 77 applied to the substrate.

The processor 73 is connected to the memory unit 74 and the transmission module 75A. The warping state information generated by the processor 73 is transmitted to the memory unit 74 or to the transmission module 75A. Alternatively, the warping state information stored in the memory unit 74 is transferred to the transmission module 75A. The transmission module 75A transmits the warping state information to the reception module 75B. The transmission module 75A and the reception module 75B constitute a communication unit 75 that transmits and receives the warping state information of the substrate in a wireless manner. The warping state information received by the reception module 75B is visually displayed as an image on a monitor device 79. An operator can check the warping state of the substrate from the image displayed on the monitor device 79.

In an environment in which wireless communication is seamless, the warping state information generated by the processor 73 may not be stored in the memory unit 74 but may be directly transmitted to the monitor device so that the operator can check the warping state of the substrate in real time. However, in an environment where seamless wireless communication is not available, the warping state information generated by the processor 73 may be stored in the memory unit 74 for later use after the end of the treatment process.

The printed circuit board 77 may be removably attached to the substrate. For example, the printed circuit board 77 is temporarily attached to the substrate with a temporary fixing means (for example, double-sided silicone tape) having excellent heat resistance and chemical resistance. The printed circuit board 77 is mounted with the processor 73, the memory unit 74, and the transmission module 75A. The processor 73, the memory unit 74, and the transmission module 75A are connected to each other on the printed circuit board 77.

The printed circuit board 77 may be a flexible printed circuit board. When a flexible printed circuit board is used, it is possible to prevent the printed circuit board 77 from influencing the warping deformation of the substrate.

Reference numerals 72 and 76 which are shown in FIGS. 2 and 3 but are not described herein denote a second sensing unit and a battery unit, respectively.

The second sensing unit 72 includes at least one sensing module. The sensing module of the second sensing unit 72 is provided on the substrate to detect treatment process conditions such as pressure, temperature, humidity, and the like in the chamber 1. To this end, the sensing module of the second sensing unit 72 includes a pressure sensor, a temperature sensor, and a humidity sensor.

The sensing module of the second sensing unit 72 is connected to the processor 73 via a conductor. Information on treatment process conditions detected by the sensing module of the second sensing unit is transmitted to the processor 73. The treatment process condition information received by the processor 73 is transmitted to the memory unit 74 or to the transmission module 75A. The treatment process condition information stored in the memory unit 74 is transmitted to the transmission module 75A and is then delivered to the reception module 75B. The treatment process condition information received by the reception module 75B is displayed as an image on the monitor device 79. The operator can monitor the process conditions through the image displayed on the monitor device 79. Since the operator can monitor the warping deformation of the substrate according to the treatment process conditions through the images representing the warping deformation of the substrate and the treatment process conditions for the substrate, the operator can adjust the process conditions for the substrate such that the warping deformation of the substrate is minimized while visually checking the process conditions and the warping state.

Each of the sensing modules of the second sensing unit 72 is removably attached to the substrate. For example, the sensing module of the second sensing unit 72 may be temporarily attached to the substrate by a temporary fixing means, such as a double-sided silicone tape, having excellent heat resistance and chemical resistance.

The battery unit 76 is mounted on the printed circuit board 77 and supplies electric energy to the first sensing unit 71, the second sensing unit 72, the processor 73, and the transmission module 75A.

According to one embodiment of the present invention, when a treatment process is initiated, the following is performed: a test substrate to which the first sensing unit 71, the second sensing unit 72, the processor 73, the memory unit 74, the transmission module 75A, the battery unit 76, and the printed circuit board 77 are attached is first introduced into the treatment chamber 1; the warping deformation of the test substrate is monitored while a treatment process is performed on the test substrate; the process conditions are adjusted according to the results of the monitoring such that the warping deformation of the test substrate is minimized; and a treatment process performed on an actual substrate in the adjusted process conditions. The first sensing unit 71 temporarily attached to the substrate may be replaced with another first sensing unit 71 having a different arrangement.

Since each of the plurality of sensing modules 71A, 71B, and 71C includes a tilt sensor, it is possible to check whether a substrate to be treated is horizontally supported and then to perform a treatment process on the substrate that is horizontally supported.

Figure 4:
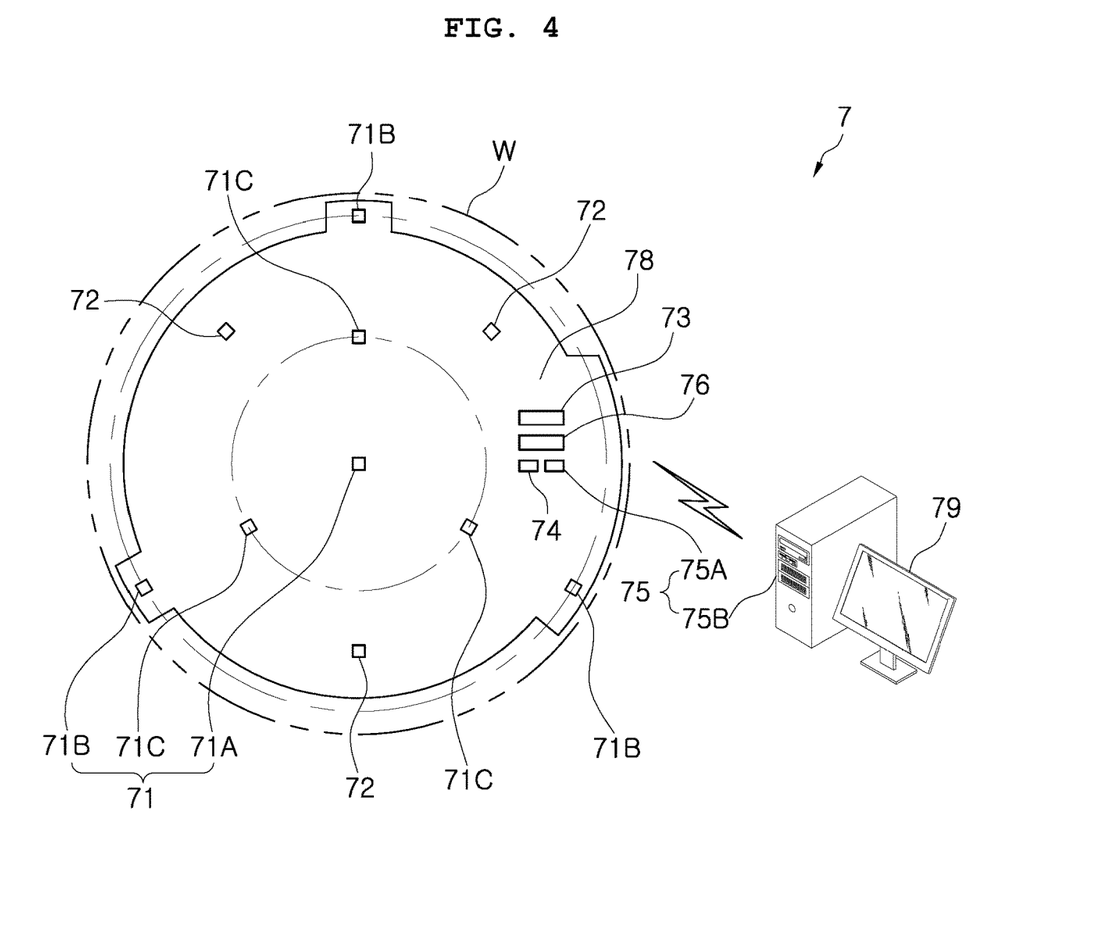
FIG. 4 is a configuration view illustrating another example of a substrate warpage monitoring apparatus applied to the substrate treatment apparatus according to one embodiment of the present invention.

FIG. 4 illustrates a substrate warpage monitoring apparatus according to a second embodiment of the present invention. As illustrated in FIG. 4, this substrate warpage monitoring apparatus 7 according to this embodiment basically the same as the former embodiment in terms of the construction and function. Only a different point of this apparatus is that the first sensing unit 71, the second sensing unit 72, the processor 73, the memory unit 74, the transmission module 75A, and the battery unit 76 are mounted on a flexible printed circuit board 78 that is removably attached to a substrate. The flexible printed circuit board 78 has a sufficiently large size to be mounted with all of the first sensing unit 71, the second sensing unit 72, the processor 73, the memory unit 74, the transmission module 75A, and the battery unit 76. The first sensing unit 71, the second sensing unit 72, the processor 73, the memory unit 74, the transmission module 75A, and the battery unit 76 are connected to each other on the flexible printed circuit board 77. The substrate warpage monitoring apparatus according to the second embodiment has an advantage of easily apply and remove the first sensing unit 71, the second sensing unit 72, the processor 73, the memory unit 74, the transmission module 75A, and the battery unit 76 to and from a substrate to be treated by simply mounting or dismounting the flexible printed circuit board 78 mounted with the first sensing unit 71, the second sensing unit 72, the processor 73, the memory unit 74, the transmission module 75A, and the battery unit 76 to and from the substrate.

Figure 5:
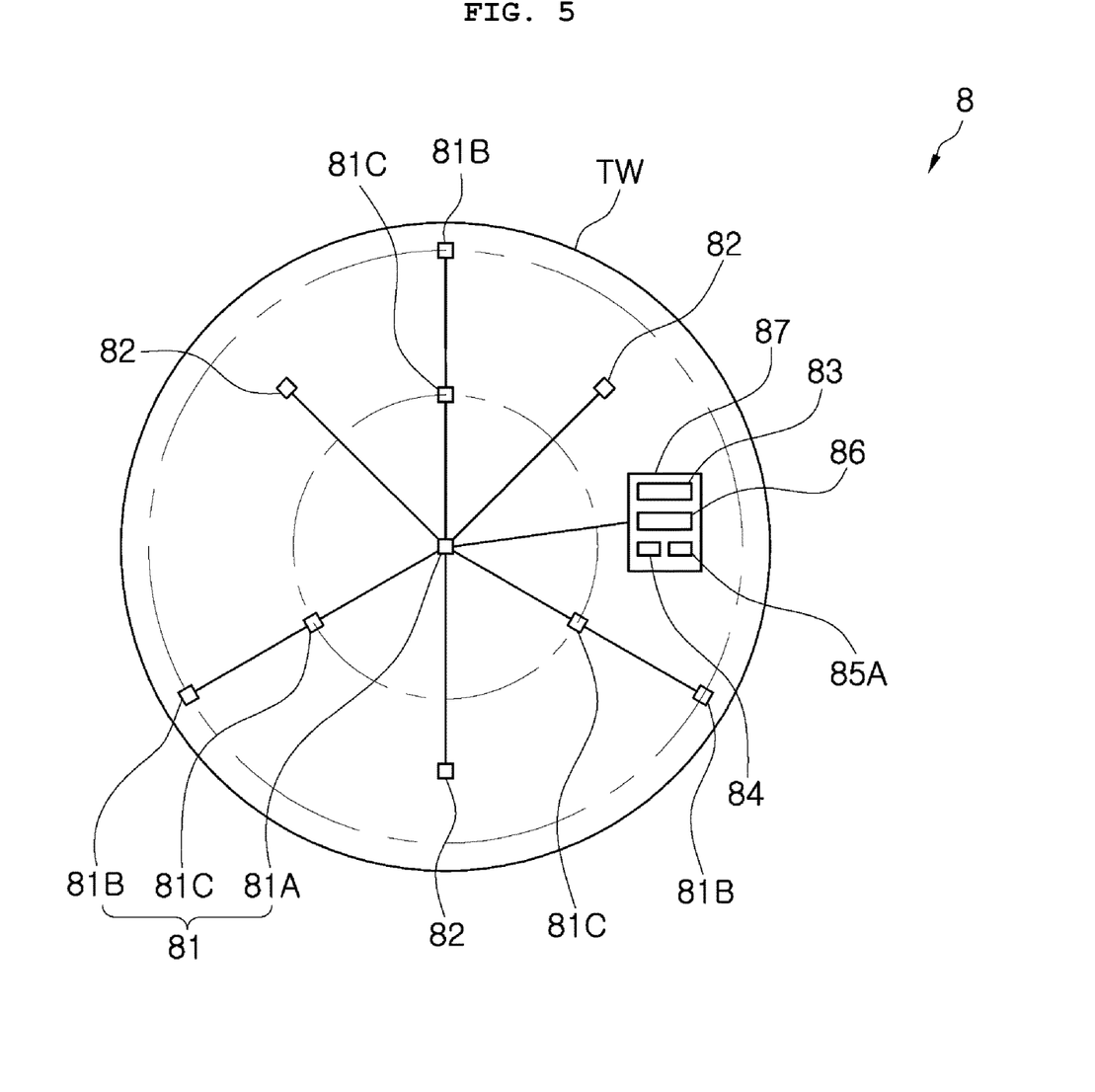
FIG. 5 is a configuration view illustrating a substrate-type sensor according to one embodiment of the present invention.

FIG. 5 is a configuration view illustrating a substrate-type (wafer-type) sensor according to one embodiment of the present invention. Referring to FIG. 5, the substrate-type sensor 8 according to one embodiment of the present invention includes a configuration in which a first sensing unit 81, a second sensing unit 82, a processor 83, a memory unit 84, a transmission module 85A, a battery unit 86, and a printed circuit board 87 are applied to a substrate.

A test substrate TW is fabricated to have the same shape factor as an actual substrate. Since the first sensing unit 81, the second sensing unit 82, the processor 83, the memory unit 84, the transmission module 85A, the battery unit 86, and the printed circuit board 87 are the same as or similar to the counter parts included in the substrate warpage monitoring apparatus according to the first or second embodiment described above, a detailed description thereof will be omitted.

The first sensing unit 81, the second sensing unit 82, and the printed circuit board 87 may be permanently fixed to the test substrate TW by a permanent fixing means (such as epoxy resin) having excellent heat resistance and chemical resistance.

Reference numerals 71A, 71B, and 71C in FIG. 4 represent sensing modules that constitute the first sensing unit 81.

When the treatment process is initiated, the substrate-type sensor 8 is first introduced into the treatment chamber 1, the warping deformation of the test substrate TW is monitored during the treatment process, the treatment process conditions are adjusted according to the results of the monitoring such that the warping deformation of a substrate to be treated is minimized.

Although the embodiments of the present invention have been described above, the present invention is not limited by the disclosed embodiments and the accompanying drawings, and those skilled in the art will appreciate that various modifications and equivalents to the embodiments can be made without departing from the technical spirit of the present invention. In addition, the technical ideas described in the respective embodiments of the present invention can be implemented independently of each other or can be implemented in combination.

What is claimed is:

1. A substrate warpage monitoring apparatus comprising:
   a sensing unit that is removably disposed on a substrate and is configured to detect warpage information of the substrate during a time when a treatment process is performed on the substrate; and
   a processor operatively coupled to the sensing unit and configured to generate warpage state information of the substrate on the basis of the warpage information detected by the sensing unit,
   wherein the sensing unit comprises a plurality of sensing modules disposed at positions spaced apart from each other on the substrate and configured to detect the warpage information generated at the respective positions at which the sensing modules are disposed, and
   wherein the processor collects the warpage information detected by each of the sensing modules to generate the warpage state information.

2. The apparatus according to claim 1,
   wherein the sensing modules are spaced apart from each other at regular intervals in a radial direction from a center portion of the substrate.

3. The apparatus according to claim 1,
   wherein the plurality of sensing modules comprises:
   at least one central sensing module disposed in a central region on the substrate;
   a plurality of peripheral sensing modules disposed in an edge region on the substrate; and
   a plurality of intermediate sensing modules disposed in an intermediate region between the central region and the edge region.

4. The apparatus according to claim 1,
   wherein each of the plurality of sensing modules comprises an acceleration sensor or a gyro sensor.

5. The apparatus according to claim 1,
   wherein each of the sensing modules comprises a composite sensor including an acceleration sensor and a gyro sensor.

6. The apparatus according to claim 1, further comprising:
   a printed circuit board removably provided on the substrate,
   wherein the processor is mounted on the printed circuit board.

7. The apparatus according to claim 6,
   wherein the printed circuit board is a flexible printed circuit board.

8. The apparatus according to claim 1, further comprising:
   a memory unit configured to store the warpage state information generated by the processor.

9. The apparatus according to claim 8, further comprising:
   a printed circuit board removably provided on the substrate,
   wherein the memory unit is mounted on the printed circuit board.

10. The apparatus according to claim 1, further comprising:
    a communication unit including a transmission module and a reception module,
    wherein the transmission module is configured to transmit the warpage state information generated by the processor to the reception module.

11. The apparatus according to claim 10, further comprising:
    a printed circuit board removably provided on the substrate,
    wherein the processor and the transmission module are mounted on the printed circuit board.

12. The apparatus according to claim 10,
    wherein the transmission module and the reception module are configured to transmit and receive the warpage state information wirelessly.

13. A substrate treatment apparatus comprising:
    a chamber having a treatment space;
    a substrate support unit including a spin head configured to support and rotate a substrate in the treatment space;
    a fluid supply unit configured to supply a treatment fluid onto an upper surface of the substrate supported on the substrate support unit;
    a first sensing unit provided on the substrate and configured to detect warpage information of the substrate during a treatment process in which the substrate is rotated and the treatment fluid is supplied onto the substrate; and
    a processor mounted on a flexible printed circuit board provided on the substrate and configured to generate warpage state information of the substrate on the basis of the warpage information detected by the first sensing unit,
    wherein the first sensing unit comprises a plurality of sensing modules disposed at positions spaced apart from each other on the substrate and configured to detect the warpage information generated at the respective positions at which the sensing modules are disposed, and
    wherein the processor collects the warpage information detected by each of the sensing modules to generate the warpage state information.

14. The apparatus according to claim 13, further comprising:
    a second sensing unit provided on the substrate and configured to detect at least one parameter selected from among pressure, temperature, and humidity of the treatment space during the treatment process performed on the substrate.

15. The apparatus according to claim 13, wherein each of the plurality of sensing modules comprises an acceleration sensor or a gyro sensor.

16. The apparatus according to claim 13, wherein the substrate provided with the first sensing unit and the flexible printed circuit board corresponds to a test substrate, and wherein the test substrate, the first sensing unit, the flexible printed circuit board, and the processor constitute a substrate-type sensor.

17. The apparatus of claim 16, wherein the substrate-type sensor comprises:

a second sensing unit provided on the test substrate and configured to detect at least one parameter selected from among pressure, temperature, and humidity of the treatment space during the treatment process;

a memory unit mounted on the flexible printed circuit board and configured to store the warpage state information generated by the processor and the parameter detected by the second sensing unit;

a transmission module mounted on the flexible printed circuit board and configured to transmit the warpage state information stored in the memory unit.

18. A substrate-type sensor comprising:

a test substrate;

a sensing unit provided on the test substrate and configured to detect warpage information of the test substrate; and a processor provided on the test substrate and configured to generate warpage state information of the test substrate on the basis of the warpage information detected by the sensing unit, wherein the sensing unit comprises a plurality of sensing modules disposed at positions spaced apart from each other on the substrate and configured to detect the warpage information generated at the respective positions at which the sensing modules are disposed, wherein the processor collects the warpage information detected by each of the sensing modules to generate the warpage state information, and wherein each of the plurality of sensing modules comprises an acceleration sensor or a gyro sensor.

19. The substrate-type sensor according to claim 18, further comprising:

a memory unit provided on the test substrate and configured to store the warpage state information generated by the processor; and a transmission module provided on the test substrate and configured to transmit the warpage state information stored in the memory unit.

* * * * *